(12) United States Patent
Huang et al.

(10) Patent No.: US 7,253,459 B2
(45) Date of Patent: Aug. 7, 2007

(54) SEMICONDUCTOR DEVICES AND METHODS OF MANUFACTURE THEREOF

(75) Inventors: Eddie Huang, Stockport (GB); Sandra M. Crosbie, Sale (GB)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 10/533,725

(22) PCT Filed: Oct. 24, 2003

(86) PCT No.: PCT/IB03/04742

§ 371 (c)(1),
(2), (4) Date: May 3, 2005

(87) PCT Pub. No.: WO2004/042825

PCT Pub. Date: May 21, 2004

(65) Prior Publication Data

US 2006/0043434 A1    Mar. 2, 2006

(30) Foreign Application Priority Data

Nov. 6, 2002    (GB) .................................. 0225812.7

(51) Int. Cl.
*H01L 29/94*    (2006.01)
*H01L 21/336*    (2006.01)

(52) U.S. Cl. ........................ 257/288; 438/301
(58) Field of Classification Search ............. 257/331, 257/330, 288; 438/259, 301
See application file for complete search history.

(56) References Cited

U.S. PATENT DOCUMENTS

| 6,475,864 B1 | 11/2002 | Sato et al. |
| 6,600,194 B2 * | 7/2003 | Hueting et al. ............. 257/331 |
| 2002/0027237 A1 | 3/2002 | Onishi et al. |

* cited by examiner

*Primary Examiner*—Carl Whitehead, Jr.
*Assistant Examiner*—Monica D. Harrison
(74) *Attorney, Agent, or Firm*—Peter Zawilski

(57) ABSTRACT

A semiconductor device, for example a MOSFET or IGBT, includes a region (30, 36, 50) in the drain drift region (14) juxtaposed with its channel-accommodating region (15) and spaced from the drain contact region (14a) by means of an intermediate portion of the drift region. The region comprises alternating stripes (31, 32) of the first and second conductivity types, which stripes extend alongside the channel-accommodating region (15). In a trench gated device the stripes are elongated in a direction perpendicular to the trench walls. In a planar gate device the stripes extend around the periphery of the channel-accommodating region (15) leaving the region near the gate in a direction perpendicular with respect to the gate electrotes. The dimensions and doping levels of the stripes (31, 32) are selected such that region (30, 36, 50) provides a voltage-sustaining space-charge zone when depleted. The invention enables reduction of lateral current spreading resistance in the drain drift region (14) without significantly degrading the breakdown properties of the device.

10 Claims, 3 Drawing Sheets

SEMICONDUCTOR DEVICES AND METHODS OF MANUFACTURE THEREOF

The present invention relates to power semiconductor transistor devices and methods of manufacture of such devices. More particularly, it is concerned with reducing the switching energy losses and on resistance of these devices.

Ideally, a power device would be able to switch between its "off-state" and "on-state" (and vice versa) with no power dissipation. However, substantial switching power losses occur in real power devices and there has always therefore been a desire to design the devices so as to minimise these losses, particularly for applications requiring high frequency switching.

An important factor in switching losses of power semiconductor transistor devices is the gate-drain capacitance or Cgd. It can be reduced by increasing the pitch between the gates in adjacent cells of the device, but this has the disadvantage of increasing the on resistance of the device. This is because the channel width per unit area of device is decreased and also, the contribution to the on resistance of the current spreading laterally in the drain drift region is significantly increased.

U.S. Pat. No. 5,688,725 describes reduction of the on resistance of a vertical trench-gate MOSFET by inclusion of a layer of increased dopant concentration in the drain drift region of the device. It serves to spread out the current as it emerges from the channel of the MOSFET by providing a lower resistance path. However, inclusion of such a higher doped layer will tend to impair the breakdown properties of the device.

It is an object of the present invention to provide power semiconductor transistor device structures having improved operating characteristics and methods for the manufacture thereof.

The present invention provides a semiconductor device including a semiconductor body comprising a source region and a drain region of a first conductivity type, having therebetween a channel-accommodating region of an opposite, second conductivity type, the drain region comprising a drain drift region and a drain contact region, with the drain drift region between the channel-accommodating region and the drain contact region, and the drain drift region being doped to a lesser degree than the drain contact region, an insulated gate separated from the channel-accommodating region by a gate insulating layer, and a localised region in the drain drift region juxtaposed with the channel-accommodating region, the localised region comprising alternating stripes of the first conductivity type and a second, opposite conductivity type, which stripes extend laterally alongside the channel-accommodating region and away from the gate, the dimensions of the stripes being such that the localised region provides a voltage-sustaining space-charge zone when depleted.

The inclusion of such a localised region close to the channel-accommodating region provides low resistance paths to encourage lateral current spreading when the device is turned on. Furthermore, the average doping of the stripes will govern the breakdown voltage of the localised region. Thus, owing to the presence of the stripes of the second conductivity type, the stripes of the first conductivity type can provide low resistance paths relative to the drain drift region without a commensurate decrease in the breakdown voltage of the device.

It will be appreciated by those skilled in the relevant art that a voltage-sustaining space-charge zone in the localised region results from charge-carrier depletion of the interposed first and second conductivity type regions. The intermediate dimensions (width or thickness) of the interposed first and second conductivity regions need to be small enough (in relation to their dopant concentrations) to allow depletion of the region across its intermediate dimension without the resulting electric field reaching the critical field strength at which avalanche breakdown would occur in that semiconductor. This is an extension of the famous RESURF principle. Thus, the depletable multiple-region material may be termed "multiple RESURF" material. In the voltage-sustaining zone formed of first regions of one conductivity type interposed with second regions of the opposite conductivity type, the dopant concentration and dimensions of the first and second regions are such that (when depleted in a high voltage mode of operation) the space charge per unit area in the first and second regions balances at least to the extent that the electric field resulting from the space charge is less than the critical field strength at which avalanche breakdown would occur in that zone.

United States patent specification U.S. Pat. No. 4,754,310 (our ref: PHB32740) discloses semiconductor devices with depletable multiple-region (multiple RESURF) semiconductor material comprising alternating p-type and n-type regions which together provide a voltage-sustaining space-charge zone when depleted. The use of such material for the space-charge zone permits the achievement of a lower on-resistance in the device having a given breakdown voltage and is particularly advantageous for high voltage MOSFET devices, both lateral devices and vertical devices. The whole contents of U.S. Pat. No. 4,754,310 are hereby incorporated herein as reference material.

In a preferred embodiment, the average doping level of the localised region is substantially the same as that of an adjacent portion of the drain drift region. In that case, the presence of the localised region has a negligible effect on the breakdown properties of the device, whilst still reducing its on resistance.

The localised region may be spaced from the channel-accommodating region. In other embodiments, the localised region abuts against the channel-accommodating region, so that as the on current emerges from the channel-accommodating region, it immediately enters the localised region.

In some embodiments, the localised region is spaced from the gate insulating layer. This may serve to reduce the likelihood of breakdown occurring near a corner of the gate trench owing to the increased dopant concentrations in the localised region.

The invention further provides a method of manufacturing a semiconductor device including a semiconductor body comprising a source region and a drain region of a first conductivity type, having therebetween a channel-accommodating region, the drain region comprising a drain drift region and a drain contact region, with the drain drift region between the channel-accommodating region and the drain contact region, and the drain drift region being doped to a lesser degree than the drain contact region, and an insulated gate separated from the channel-accommodating region by a gate insulating layer, the method including the step of:

forming a localised region in the drain drift region juxtaposed with the channel-accommodating region, the localised region comprising alternating stripes of the first conductivity type and a second, opposite conductivity type, which stripes extend laterally alongside the channel-accommodating region and away from the gate.

Embodiments of the invention will now be described by way of example and with reference to the accompanying schematic drawings, wherein.

Figure 1:
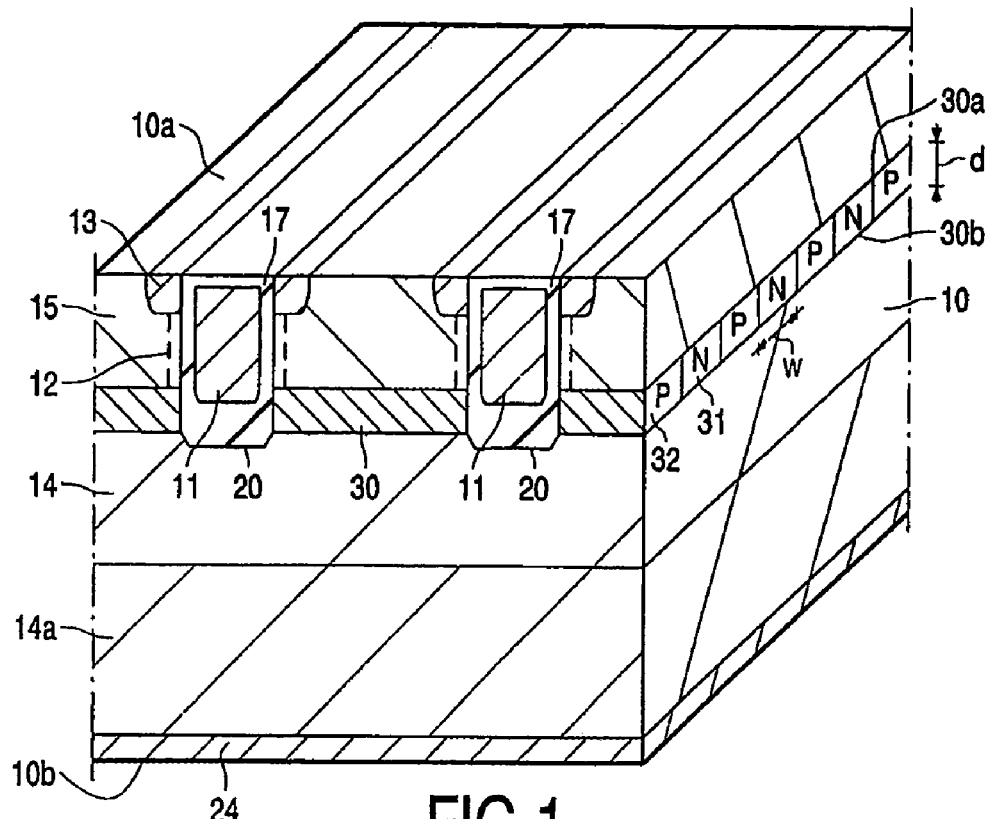
FIG. 1 is a cross-sectional view of transistor cell areas of a trench-gate semiconductor device according to a first embodiment of the invention.

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar features in modified and different embodiments.

FIG. 1 illustrates an exemplary embodiment of the invention, in the form of a power semiconductor device having a trench-gate 11. In the transistor cell areas of this device, source and drain drift regions 13 and 14, respectively, of a first conductivity type (n-type in this example) are separated by a channel-accommodating body region 15 of the opposite second conductivity type (i.e. p-type in this example). The gate 11 is present in a trench 20 which extends through the regions 13 and 15, and into the drain drift region 14. The gate is separated from the semiconductor body by a gate insulating layer 17.

The application of a voltage signal to the gate 11 in the on-state of the device serves in known manner for inducing a conduction channel 12 in the region 15 and for controlling current flow in this conduction channel 12 between the source and drain drift regions 13 and 14.

The source region 13 is contacted by a source electrode (not shown for purposes of clarity in the Figure) at the top major surface 10a of the device semiconductor body 10. By way of example, FIG. 1 shows a vertical device structure in which the region 14 may formed by an epitaxial layer of higher resistivity (lower doping) on a substrate drain contact region 14a of higher doping. This drain contact region 14a may be of the same conductivity type (n-type in this example) as the region 14 to provide a vertical MOSFET, or it may be of opposite conductivity type (p-type in this example) to provide a vertical IGBT. The drain contact region 14a is contacted at the bottom major surface 10b of the device body by an electrode 24, called the drain electrode in the case of a MOSFET and called the anode electrode in the case of an IGBT.

A localised region 30 is provided in the drain drift region 14, and extends laterally in a thin layer below the channel-accommodating region 15. The region 30 is juxtaposed with the channel-accommodating region. In the illustrated embodiment, the upper edge 30a of the localised region abuts against the channel-accommodating region 15. Typically, the depth, d, of the localised region between its upper and lower edges 30a and 30b may be of the order of 1 μm. The lower edge or boundary 30b of the localised region is shown above the bottom of the trench 20 but may be below the bottom of the trench in other embodiments. A boundary of the localised region occurs where the dopant concentration ceases to decrease (that is, either remains the same or increases).

The localised region 30 comprises alternating stripes 31, 32 of n and p conductivity types, respectively. The stripes extend along the channel-accommodating region 15 and away from the gate 11. In the embodiment of FIG. 1, the stripes are elongate in a lateral direction substantially perpendicular to the trenches 20. In this case, they are substantially straight and parallel.

The respective dimensions and doping levels of the stripes 31, 32 are selected such that the localised region provides a voltage-sustaining space-charge zone when depleted. The average doping level in the localised region is preferably predetermined to be substantially the same as that of the drain drift region 14 immediately below the localised region. Typically, in a trench-gate MOSFET having the configuration shown in FIG. 1, the stripes may be equal in width, w, which is of the order of 0.5 μm. The greater the dopant concentrations of the stripes, the lower the resistance of the current paths provided by the n-type stripes. It will be appreciated that, the higher the dopant concentrations are, the narrower the stripes need to be to ensure that the electric field in the localised region when depleted is less than the critical field strength at which breakdown would occur.

Whilst the stripes 31, 32 are shown to be of equal width in FIG. 1, it will be appreciated that the same average doping level may also be achieved by varying the respective widths and doping levels of the stripes of each conductivity type.

No plan view of the cellular layout geometry is shown in the drawings, because the invention is applicable to a range of known cell geometries. Thus, for example the cells may have an elongate stripe geometry as shown in FIG. 1. In other embodiments, they may have a square geometry, or they may have a close-packed hexagonal geometry. In each case, the trench 20 (with its gate 11) extends around the boundary of each cell. Where a gate geometry other than parallel stripes is used, the stripes of the localised region may be tapered, rather than of constant width. For example, in square or hexagonal geometries, the width of the stripes of the localised region may decrease towards the centre of the closed cells defined by the gate.

FIG. 1 shows only a few cells, but typically the device comprises many hundreds of these parallel cells between the source electrode (not shown) and drain electrode 24. The active cellular area of the device may be bounded around the periphery of the body 10 by various known peripheral termination schemes (also not shown). Such schemes normally include the formation of a thick field-oxide layer at the peripheral area of the body surface 10a, before the transistor cell fabrication steps. Furthermore, various known circuits (such as gate-control circuits) may be integrated with the device in an area of the body 10, between the active cellular area and the peripheral termination scheme. Typically their circuit elements may be fabricated with their own layout in this circuit area using some of the same masking and doping steps as are used for the transistor cells.

Figure 2:
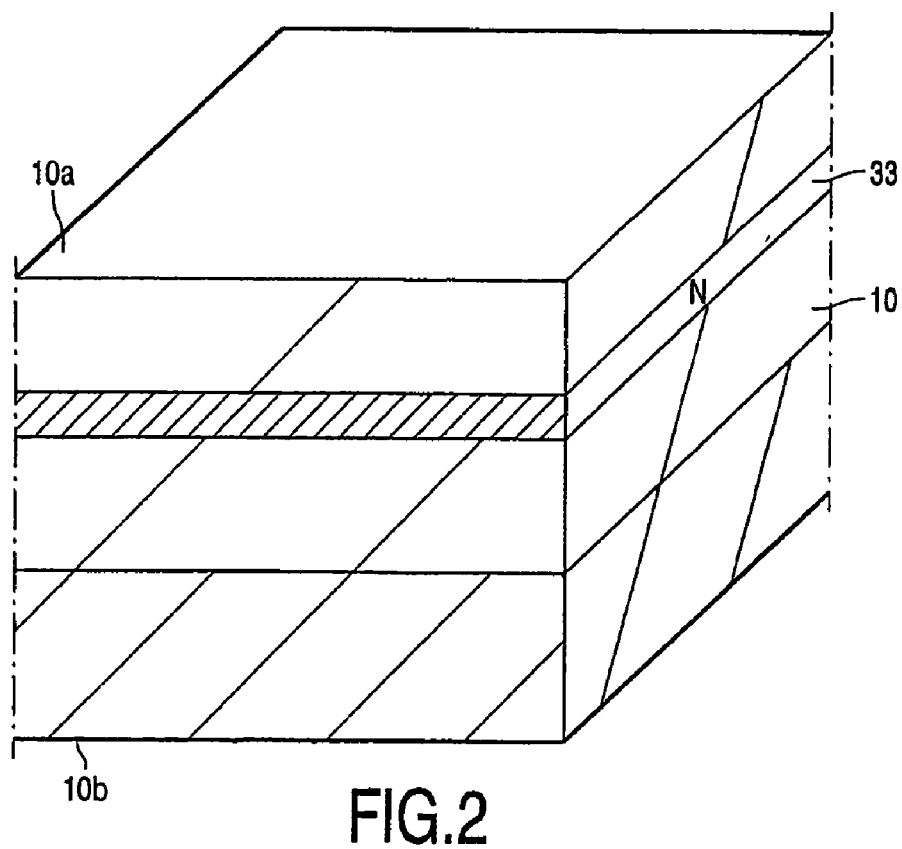
FIGS. 2 and 3 are cross-sectional views of a semiconductor body at successive stages in the manufacture of the device of FIG. 1 by one example of a method embodying the invention.
Figure 3:
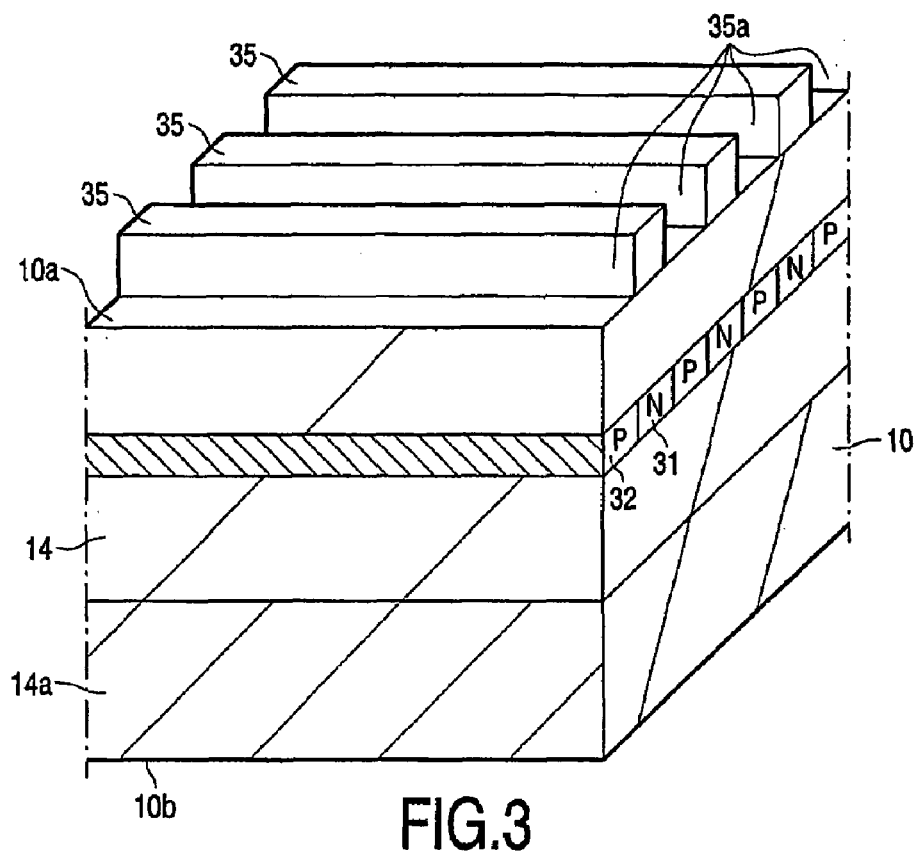

Steps in the fabrication of the transistor cells shown in FIG. 1 in accordance with an embodiment of the invention will now be described with reference to FIGS. 2 and 3.

N-type dopant, for example phosphorus is implanted into a semiconductor body 10 throughout what will be the active area of the finished device. The implantation is carried out at a high energy, of the order of 400 keV, to provide an n-type layer 33 as shown in FIG. 2 of the desired width at the desired depth.

A short oxidation process is carried out. A striped mask 35 is then defined over the top major surface 10a of the semiconductor body 10. The mask may be patterned in a standard manner using photolithography and etching, and may be formed of silicon dioxide, for example. The stripes of the mask are arranged to extend substantially perpendicular to the direction of the striped trenches 20 of the finished device.

A p-type dopant, such as boron for example, is then implanted into the semiconductor body 10 through the windows 35a defined by the mask 35. This implantation is also carried out at high energy of around 200 keV, overdoping the n-type layer 33, to form p-type stripes 32 with n-type stripes 31 therebetween.

In a trench-gate MOSFET having a breakdown voltage of say 100V, the drift region dopant concentration is around $2 \times 10^{15}$ atoms/cm$^3$, and n-type layer 33 may have a dopant concentration of around, $8 \times 10^{15}$ atoms/cm$^3$ which is overdoped by p-type dopant at a concentration of around $1 \times 10^{16}$ atoms/cm$^3$.

Alternatively, it will be appreciated that a p-type dopant may be implanted initially to form layer 33, to be subsequently overdoped by an n-type implant forming the layer of alternating n- and p-type stripes shown in FIG. 3. In that case, the n- and p-type dopant concentrations given by way of example above would be interchanged. Furthermore, whilst boron and phosphorus dopants are referred to above, it will be readily apparent that they may be substituted by other p- and n-type dopants.

Following formation of stripes 31 and 32, the mask 35 is then etched away. Further processing may be carried out in a well known manner to form the striped trench-gate structures perpendicular to the stripes 31 and 32, source and channel-accommodating regions 13 and 15, and drain electrode 24 shown in FIG. 1. Thermal treatments during this subsequent processing will serve to activate the dopants in the localised region 30. In the embodiment illustrated, the depth of the localised region 30 is predetermined such that trenches 20 are etched completely through the region.

It will be appreciated that many variations and modifications of the above process embodiments are possible within the scope of the invention. For example, formation of the localised region 30 may be carded out later in the process of fabricating the device. The appropriate implantations may occur after formation of the trench-gate structures and channel-accommodating region 15. It may be beneficial to form the localised region at later in device fabrication to minimise diffusion of the dopants during subsequent processing.

Figure 4:
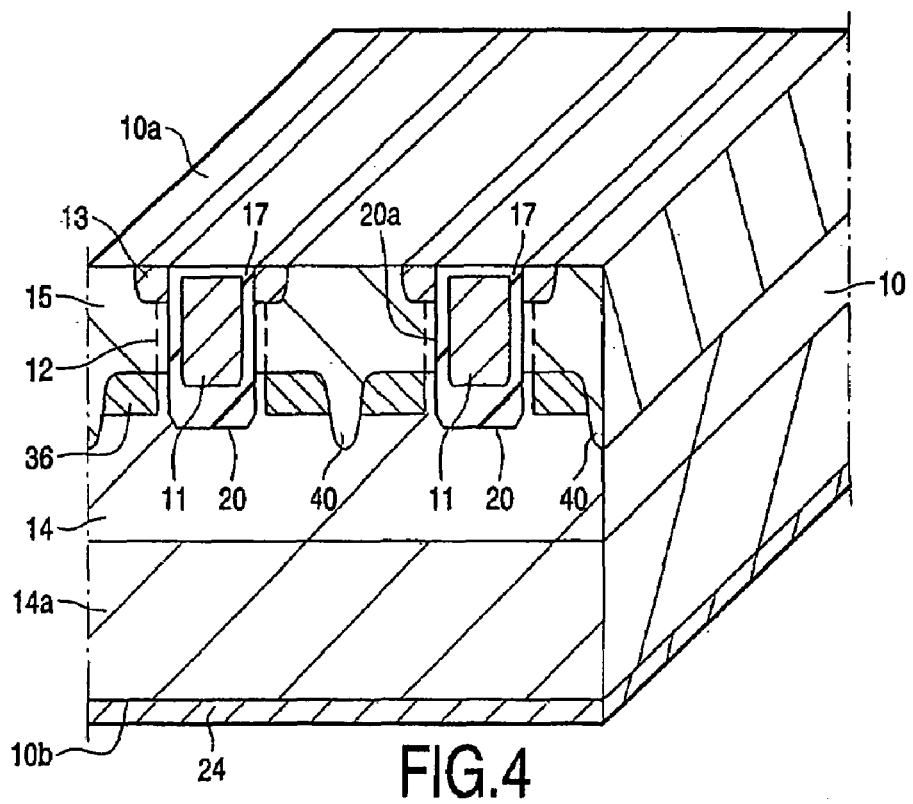
FIG. 4 is a cross-sectional view of transistor cell areas of a trench-gate semiconductor device according to a second embodiment of the invention.

FIG. 4 illustrates further variations which may be adopted, either together or independently, in accordance with the invention. Localised region 36 is laterally spaced from the sidewalls 20a of the trenches 20. This configuration of the localised region 36 may be achieved by using an appropriate mask during implantation of the n- and p-type dopants to form the region. FIG. 4 also shows a deeper implanted, more highly doped (p+) region 40 between adjacent trenches 20 to improve device ruggedness. This more highly doped region 40 may be implanted through windows of an appropriate mask. This step may be carried out, for example, after formation of the localised region, at the stage shown in FIG. 3.

The particular examples described above are n-channel devices, in which the regions 13 and 14 are of n-type conductivity, the region 15 is of p-type, and an electron inversion channel 12 is induced in the region 15 by the gate 11. By using opposite conductivity type dopants, a p-channel device can be manufactured by a method in accordance with the invention. In this case, the regions 13 and 14 are of p-type conductivity, the region 15 is of n-type, and a hole inversion channel 12 is induced in the region 15 by the gate 11.

A device may also be made in accordance with the invention of the p-channel type, having p-type source and drain regions 13 and 14a, and a p-type channel-accommodating region 15. It may also have an n-type deep localised region within each cell. N-type polycrystalline silicon may be used for the gate 11. In operation, a hole channel 12 is induced in the region 15 by the gate 11 in the on-state. The low-doped p-type region 15 may be wholly depleted in the off-state, by depletion layers from the insulated gate 11 and from the deep n-type region. Equally, a device having the same structure but with opposite conductivity types and an electron channel may be fabricated in accordance with the invention.

A vertical discrete device has been illustrated with reference to FIGS. 1 to 4, having its second main electrode 24 contacting the region 14a at the back surface 10b of the body 10. However, an integrated device is also possible in accordance with the invention. In this case, the region 14a may be a doped buried layer between a device substrate and the epitaxial low-doped drain region 14. This buried layer region 14a may be contacted by an electrode 24 at the front major surface 10a, via a doped peripheral contact region which extends from the surface 10a to the depth of the buried layer.

Figure 5:
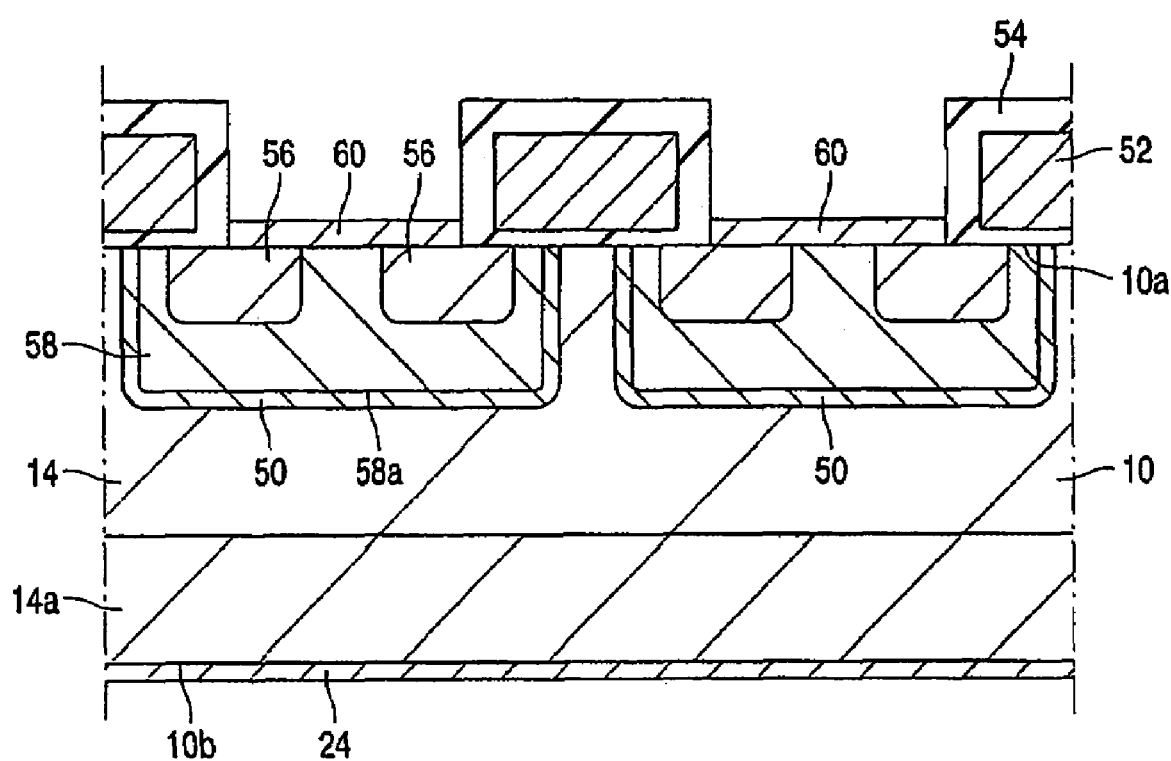
FIG. 5 is a cross-sectional view of transistor cell areas of a planar-gate DMOS semiconductor device according to a third embodiment of the invention.

The benefits of the present invention may also be applied to a planar gate vertical DMOS device, as illustrated in FIG. 5. The device includes planar gate electrodes 52 provided over the semiconductor body 10 and separated from its top major surface 10a by an insulating layer 54. The gate electrodes are elongated in a direction perpendicular to the plane of the drawing cross-section. Source regions 56 (n-type in this example) are defined in the semiconductor body 10 adjacent the top major surface 10a, and are separated from the drain drift region 14 by channel-accommodating region 58 (p-type in this example). A source electrode 60 is provided on the top major surface 10a, in contact with the source regions 56 and channel-accommodating region 58. These device features may be fabricated and interoperate in a well known manner.

In accordance with the invention, a localised region 50 is included in the device of FIG. 5. The localised region is immediately adjacent to the channel-accommodating region 58 and extends from the gate insulating layer 54, around the periphery 58a of the channel-accommodating region 58 within the drain drift region 14. The localised region 50 comprises alternating stripes of the first and second conductivity types, which stripes extend away from and substantially perpendicularly with respect to the gate electrodes 52.

Inclusion of such a localised region 50 in a planar gate vertical DMOS device enables the distance between adjacent channel-accommodating regions 58 to be reduced without increasing the on resistance of the device. The localised region serves to alleviate restriction of the on current at this location. A more compact device structure may therefore be achieved. Furthermore, reduction of the distance between adjacent channel-accommodating regions 58 will reduce Cgd and hence the switching power losses of the device.

From reading the present disclosure, other variations and modifications will be apparent to persons skilled in the art. Such variations and modifications may involve equivalent and other features which are already known in the art, and which may be used instead of or in addition to features already described herein.

Although claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable subcombination. The Applicants hereby give notice that new claims may be formulated to such features and/or combinations of such features during the prosecution of the present Application or of any further Application derived therefrom.

The invention claimed is:

1. A semiconductor device including a semiconductor body comprising a source region and a drain region of a first conductivity type, having therebetween a channel-accommodating region, the drain region comprising a drain drift region (14) and a drain contact region, with the drain drift region between the channel-accommodating region and the drain contact region, and the drain drift region being doped to a lesser degree than the drain contact region, an insulated gate separated from the channel-accommodating region by a gate insulating layer, and a localized region in the drain drift region juxtaposed with the channel-accommodating region, the localized region comprising alternating stripes of the first conductivity type and a second, opposite conductivity type, which stripes extend laterally alongside the channel accommodating region and away from the gate, the dimensions and doping levels of the stripes being such that the localized region provides a voltage-sustaining space-charge zone when depleted.

2. A device of claim 1, wherein the localised region adjoins the channel-accommodating region.

3. A device of claim 1, wherein the localised region is laterally spaced from the gate insulating layer.

4. A device of claim 1, wherein the average doping level of the localized region is substantially the same as that of an adjacent portion of the drain drift region.

5. A device of claim 1, wherein the gate is provided in a trench, the trench extending through the channel-accommodating region into the drain drift region.

6. A device of claim 5 comprising a plurality of adjacent cells, each including a gate in a trench, wherein a deep diffusion region of the second conductivity type is provided between adjacent trenches, the deep diffusion region being doped co a greater extent that the channel accommodating region.

7. A device of claim 5 wherein the lower boundary of the localized region is above the bottom of the gate trenches.

8. A device of claim 1, 2 or 3 wherein the channel-accommodating region is a region of an opposite, second conductivity type.

9. A method of manufacturing a semiconductor device including a semiconductor body comprising a source region and a drain region of a first conductivity type, having therebetween a channel-accommodating region, the drain region comprising a drain drift region and a drain contact region, with the drain drift region between the channel-accommodating region and the drain contact region, and the drain drift region being doped to a lesser degree that the drain contact region, and an insulated gate separated from the channel-accommodating region by a gate insulating layer, the method including the step of:

forming a localised region in the drain drift region juxtaposed with the channel-accommodating region, the localized region comprising alternating stripes of the first conductivity type and a second, opposite conductivity type, which stripes extend laterally alongside the channel-accommodating region and away from the gate.

10. A method of claim 9 wherein the localised region forming step comprises implanting a dopant of one of the first and second conductivity types, defining a striped mask over the semiconductor body, and implanting a dopant of the other of the first and second conductivity types.

* * * * *